(12) United States Patent
Wang et al.

(10) Patent No.: US 8,525,267 B2
(45) Date of Patent: Sep. 3, 2013

(54) DEVICE AND METHOD FOR FORMING FINS IN INTEGRATED CIRCUITRY

(75) Inventors: Chien-Hsun Wang, Hsinchu (TW); Chih-Sheng Chang, Hsinchu (TW); Yi-Tang Lin, Hsinchu (TW); Ming-Feng Shieh, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 359 days.

(21) Appl. No.: 12/953,148

(22) Filed: Nov. 23, 2010

(65) Prior Publication Data

US 2012/0126326 A1 May 24, 2012

(51) Int. Cl.
*H01L 29/66* (2006.01)

(52) U.S. Cl.
USPC .................................. 257/365; 257/E27.06

(58) Field of Classification Search
USPC ............................................ 257/365, E27.06
See application file for complete search history.

(56) References Cited

U.S. PATENT DOCUMENTS

| | | | |
|---|---|---|---|
| 6,664,582 B2 * | 12/2003 | Fried et al. .................... | 257/308 |
| 6,706,571 B1 | 3/2004 | Yu et al. | |
| 6,858,478 B2 | 2/2005 | Chau et al. | |
| 6,864,519 B2 * | 3/2005 | Yeo et al. ...................... | 257/206 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0121948 A1 * | 5/2008 | Kim et al. ...................... | 257/255 |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0065868 A1 * | 3/2009 | Russ et al. ...................... | 257/351 |
| 2009/0181477 A1 | 7/2009 | King et al. | |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Trung Q Dang
(74) *Attorney, Agent, or Firm* — Haynes and Boone, LLP

(57) ABSTRACT

A semiconductor FinFET device includes a plurality of gate lines formed in a first direction, and two types of fin structures. A first type of fin structures is formed in a second direction, and a second type of fin structures formed perpendicular to the first type of fin structures. A contact hole couples to one or more of the second type of fin structures.

17 Claims, 22 Drawing Sheets

(56) References Cited

U.S. PATENT DOCUMENTS

2010/0203734 A1   8/2010   Shieh et al.
2010/0237436 A1*  9/2010   Inaba ............................ 257/392
2010/0264468 A1  10/2010   Xu

OTHER PUBLICATIONS

Hsien-Hsin Lin, et al., U.S. Appl. No. 12/703,918, "Method for Fabricating a Finfet Device," filed Feb. 11, 2010, 40 pages.
Chien-Chang Su, et al., U.S. Appl. No. 12/644,869, "Method for Incorporating Impurity Element in EPI Silicon Process," filed Dec. 22, 2009, 21 pages.
Tsung-Lin Lee, et al., U.S. Appl. No. 12/622,038, "Sacrificial Offset Protection Film for a Finfet Device," filed Nov. 19, 2009, 56 pages.
Jeff J. Xu, et al., U.S. Appl. No. 12/784,207, "Method of Forming EPI Film in Substrate Trench," filed May 20, 2010, 33 pages.
Tian-Choy, et al., U.S. Appl. No. 12/756,552, "Hybrid Gate Process for Fabricating Finfet Device," filed Apr. 8, 2010, 38 pages.
Ming-Lung Cheng, et al. U.S. Appl. No. 12/780,124, "Method and Apparatus for Enhancing Channel Strain," filed May 14, 2010, 35 pages.
Jhon Jhy Liaw, U.S. Appl. No. 12/823,907, "Cell Structure for Dual-Port SRAM," filed Jun. 25, 2010, 46 pages.
Jhon Jhy Liaw, U.S. Appl. No. 12/827,406, "Rom Cell Circuit for Finfet Devices," filed Jun. 30, 2010, 32 pages.
Jhon Jhy Liaw, U.S. Appl. No. 12/823,860, "Structure and Method for SRAM Cell Circuit," filed Jun. 25, 2010, 37 pages.
Jhon Jhy Liaw, et al., U.S. Appl. No. 12/827,690, "Layout for Multiple-Fin SRAM Cell," filed Jun. 30, 2010, 35 pages.
Jeng-Jung Shen, et al., U.S. Appl. No. 12/780,060, "Automatic Layout Conversion for Finfet Device," filed May 14, 2010, 29 pages.
Jeng-Jung Shen, et al., U.S. Appl. No. 12/780,426, "Finfet Boundary Optimization," filed May 14, 2010, 28 pages.
Yu-Lien Huang, et al., U.S. Appl. No. 12/840,830, "High Surface Dopant Concentration Semiconductor Device and Method of Fabricating," filed Jul. 21, 2010, 21 pages.
Peng-Soon Lim, et al., U.S. Appl. No. 12/827,512, "Gate Structures and Method of Fabricating Same," filed Jun. 30, 2010, 41 pages.
Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.
Clement Hsingjen Wann, et al., U.S. Appl. No. 12/834,617, "In-Situ Spectrometry," filed Jul. 12, 2010, 20 pages.
Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.
Jeff J. Xu, et al, U.S. Appl. No. 12/906,820, "Fin-Like Field Effect Transistor (Finfet) Device and Method of Manufacturing Same," filed Oct. 18, 2010, 55 pages.
Jeff J. Csu, et al, U.S. Appl. No. 12/917,902, "Fin-Like Field Effect Transistor (FINFET) Device and Method of Manufacturing Same," filed Nov. 2, 2010, 61 pages.
Mark van Dal, U.S. Appl. No. 12/900,895, "Method of Fabricating a Semiconductor Device Having an Epitaxly Region," filed Oct. 8, 2010, 21 pages.
Hsin-Chih Chen, et al, U.S. Appl. No. 12/907,272, "Multi-Fin Device by Self-Aligned Castle Fin Formation," filed Oct. 19, 2010, 34 pages.
Chien-Hsun Wang, et al, U.S. Appl. No. 12/952,376, "Method for Adjusting Fin Width in Integrated Circuitry," filed Nov. 23, 2010, 27 pages.
Chien-Shun Wang, et al, U.S. Appl. No. 12/949,881, "Method for Forming Metrology Structures From Fins in Integrated Circuitry," filed Nov. 19, 2010, 16 pages.

* cited by examiner

DEVICE AND METHOD FOR FORMING FINS IN INTEGRATED CIRCUITRY

The present disclosure is related to the following commonly-assigned U.S. patent applications the entire disclosures of which are incorporated herein by reference: U.S. patent application Ser. No. 12/949,881 filed on Nov. 19, 2010, entitled "Method for Forming Metrology Structures from Fins in Integrated Circuitry"; and U.S. patent application Ser. No. 12/952,376 filed on Nov. 23, 2010, entitled "Method for Adjusting Fin Width in Integrated Circuitry."

BACKGROUND

The present disclosure relates generally to semiconductor manufacturing, and more particularly, to integrated circuit devices and methods for forming such devices.

The semiconductor industry continues to have goals of higher density, superior performance, and lower cost. Scaling of device size has been a major tool used to reach these goals. However, scaling beyond the 100 nm process technology node has several difficulties associated with it, such as gate-oxide thickness, source and drain doping depths, and current density. These difficulties have resulted in new device structures to improve the existing metal oxide semiconductor field effect transistor (MOSFET) devices. Some of these new device structures include multi-gate MOSFET devices. A Fin field effect transistor (FinFET) is a kind of multi-gate device which has a channel formed as a vertical fin. Multiple gates are formed over and along the sides of the vertical fin. A FinFET allows for a range of channel lengths and provides a broader process window for gate structures. FinFET devices typically include high aspect-ratio semiconductor fins in which the channel and source/drain regions for the transistor are formed. The increased surface area of the channel and source/drain regions in a FinFET results in faster, more reliable and better-controlled semiconductor transistor devices. These advantages have found many new applications in various types of semiconductor devices.

A process for making a FinFET device uses stringent process control, including in the area of contact landing. For example, contact holes need to overlay with thin vertical fin channels or raised source/drain well-pick-up lines. Process control for contact landing gets even more difficult when horizontal and vertical gate lines co-exist in multi-gate FinFET structures.

As such, there is need for improving fin structures and other aspects of FinFET integrated circuitry.

SUMMARY

The present disclosure provides a method for forming fins in semiconductor FinFET device, along with a corresponding semiconductor FinFET device. In one embodiment, a semiconductor FinFET device includes a plurality of gate lines formed in a first direction, and two types of fin structures. A first type of fin structures is formed in a second direction, and a second type of fin structures formed perpendicular to the first type of fin structures. A contact hole couples to one or more of the second type of fin structures.

In another embodiment, a semiconductor FinFET device includes a plurality of gate lines and a plurality of first fin structures of a first type intersecting at least one of the gate lines. The device also includes a second fin structure of a second type displaced from but coupled to one of the first fin structures as an extrusion feature. A contact hole couples to the extrusion feature of the second fin structure.

In yet another embodiment, a semiconductor FinFET device includes a first set of gate lines formed in a first direction and a second set of gate lines formed in a second direction, wherein the first and second directions are perpendicular to each other. The device also includes first fin structures of a first type intersecting the first set of gate lines in the second direction, and second fin structures of a second type intersecting the second set of gate lines in the first direction. A first contact hole couples to one or more of the first or second fin structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
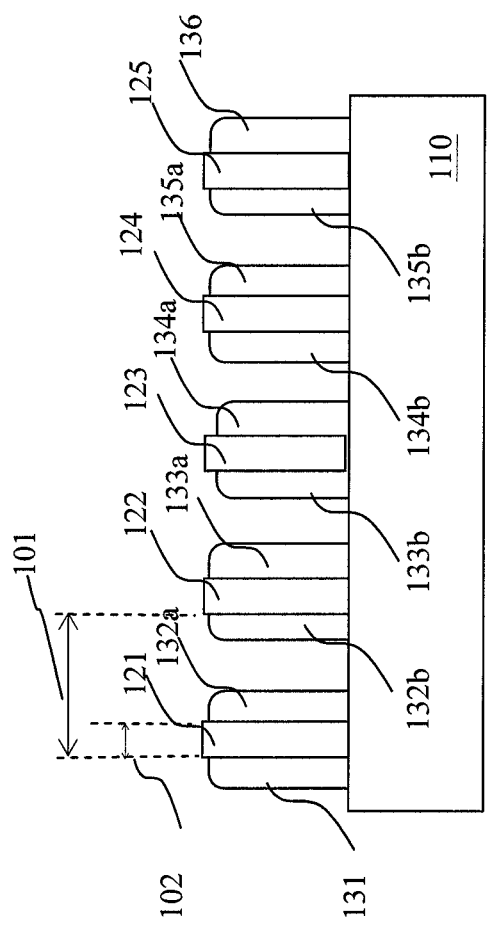
FIG. 1A is a cross section of an array of mandrels and spacers used in FinFET devices.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

Fin field effect transistors (FinFETs) use a substantially rectangular fin structure which can be formed in several ways. In a first method, bulk silicon on a substrate is etched into rectangular fin shape by first depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or deposited silicon such as silicon-on-insulator (SOI) with a barrier oxide (BOX) layer between the SOI and the underlying silicon substrate.

Both methods above use a photomask process at the desired fin dimension, often at or beyond the limit of the current photolithography technology. With the increasing demand to reduce device size, a variation of the first method was developed, in which elongated mandrels are used as a hardmask for etching into the bulk silicon, leaving thin spacers at both lateral sides of mandrel as fins after the mandrels are removed. The mandrel/spacer process is described in FIG. 1A and FIG. 1B.

Figure 1B:
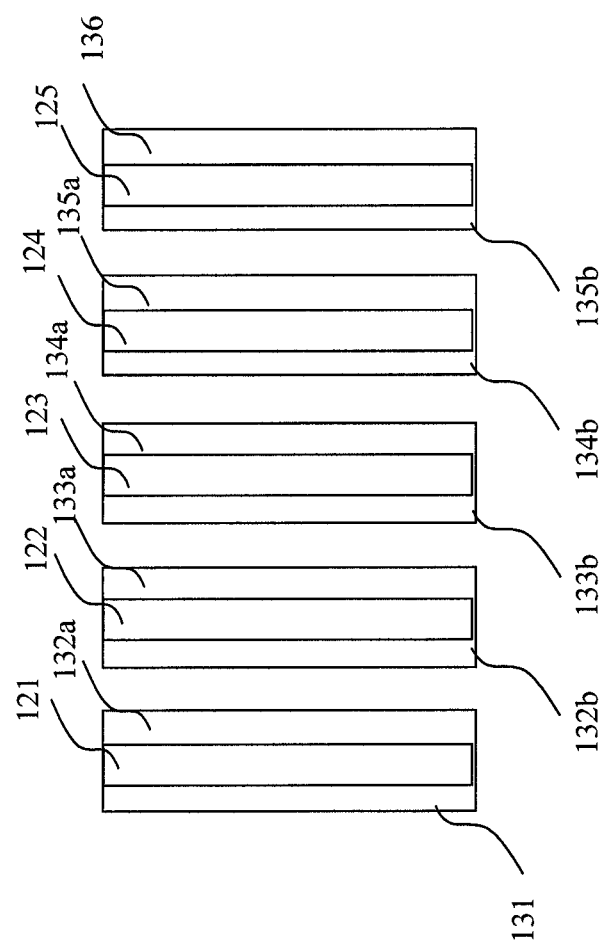
FIG. 1B illustrates the top view of the array of mandrels and spacers corresponding to FIG. 1A.
Figure 1C:
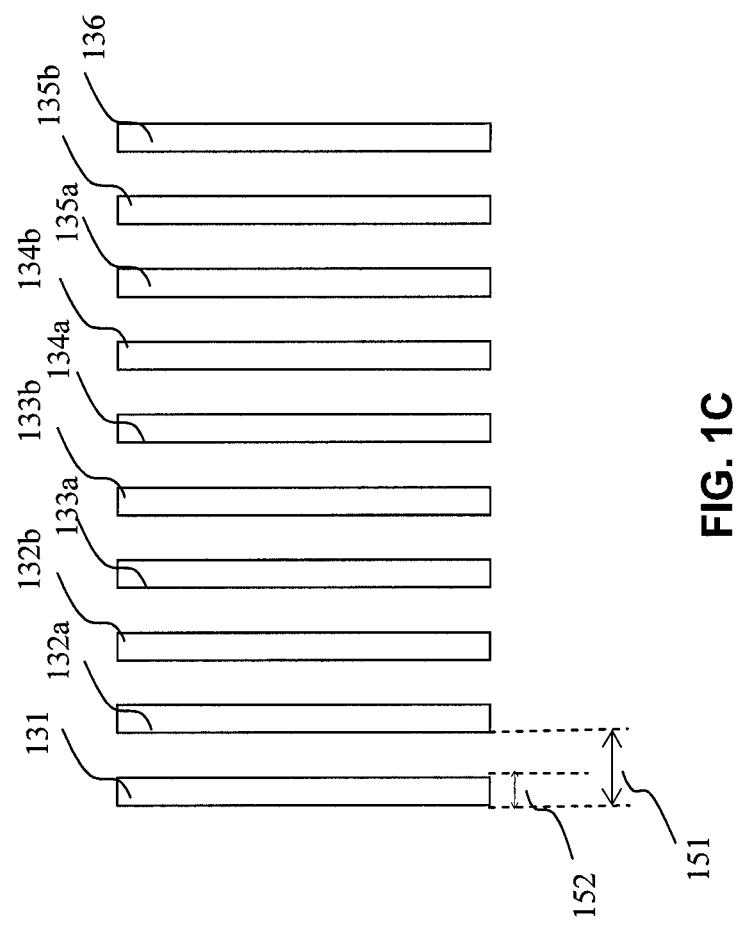
FIG. 1C is the top view of the array of fin structures resulted from the array of mandrels and spacers shown in FIG. 1A and FIG. 1B.

Referring to FIGS. 1A-1C, a semiconductor substrate 110, such as a silicon substrate, or a silicon on oxide substrate. The substrate includes an array of mandrels. Mandrals 121, 122, 123, 124, and 125 are formed by a photolithography and etch process. The mandrals are spaced at a pitch 101 and have a width 102. A conformal spacer material is then deposited around each of the mandrels 121, 122, 123, 124, and 125, forming a spacer array. In the present embodiment, the spacer array is made of a hardmask material, and spacer sidewalls 131, 132a, 132b, 133a, 133b, 134a, 134b, 135a, 135b, and 136 are thinner than the width of the mandrels 121, 122, 123, 124, and 125. In the present embodiment, the pitch and width of the mandrel array are selected such that facing sidewalls of a pair of adjacent mandrel structures are separated from each other at a distance on the order of the width 102 of a mandrel. As can be seen, mandrels 121, 122, 123, 124, and 125 are sandwiched between spacer sidewalls 131 and 132a, 132b and 133a, 133b and 134a, 134b and 135a, 135b and 136 respectively.

The mandrels 121, 122, 123, 124, and 125 between the spacers are then removed in a subsequent etching operation to leave just the spacers behind, now referred to as fin structures. It is understood that the fin structures can be used as a hardmask for etching the silicon layers below, forming additional fin structures. Using the mandrel/spacer method, the fin structures 131, 132a, 132b, 133a, 133b, 134a, 134b, 135a, 135b, and 136 are very thin and close together, and can be formed without a difficult lithography process. Thus the fin structures have a width 152 at a pitch 151 (FIG. 1C), which can be half the mandrel pitch 101. For example, the mandrel pitch varies from 20 nm to 200 nm, the mandrel width varies from 10 nm to 100 nm, and the fin width varies from 5 nm to 180 nm. The vertical fin structures are the building blocks for forming gate channels for double, triple, and multiple gate transistors in a FinFET process.

It may further be a desire to form fin structures of different widths. For example, a number of circuit components may use various lateral dimensions for various vertical structures, which may benefit from multi-sized fin structures. Furthermore, it may be desired for the fin structures formed in the above mandrel and spacer process to provide relatively-large contact landing areas on the top surface of a connection line. In addition, it may be desired to improve well-pick-up in source and drain structures, as well as improved emitter efficiency in bipolar junction transistor (BJT) integrated circuits.

A modification of the above-described method is discussed below to achieve one or more of the above-listed desires. It is further desired for the modification to maintain the fin density within the confines of existing transistor structures. Furthermore, it may be undesirable to require new photomasks to be made, especially for an existing product. Hence, it is desired to avoid creating new photomasks, and form FinFETs within the confines of the existing transistor structures so that layouts of other layers are not affected.

Figure 2A:
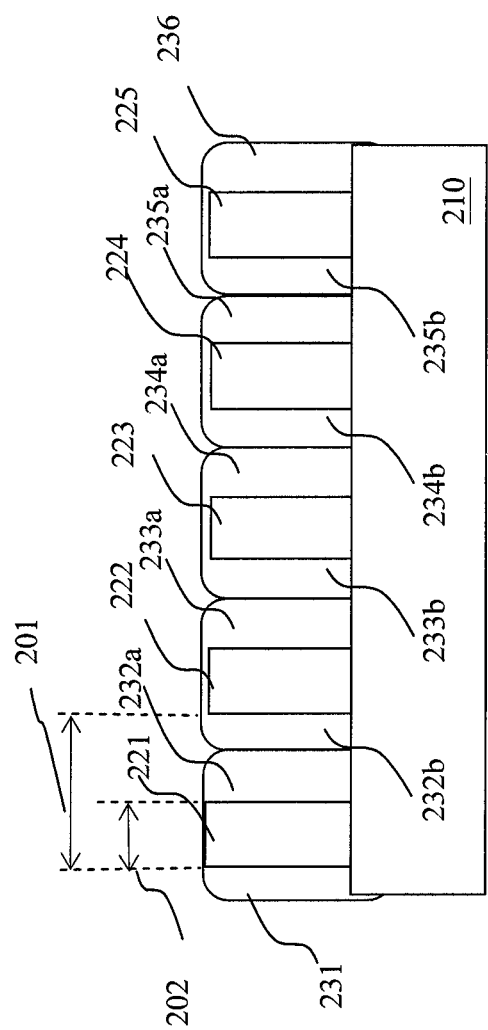
FIG. 2A and FIG. 2B are cross section and top views of an array of parallel mandrels and spacers when merged spacer technique is applied, in accordance with certain embodiments of the present disclosure.
Figure 2B:
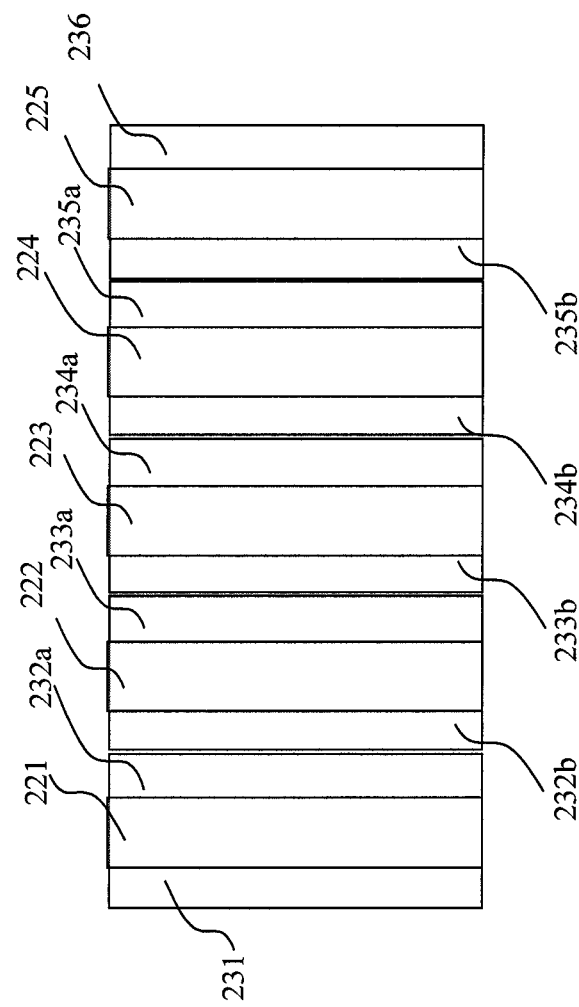

Referring now to FIGS. 2A-2B, a method of making fin structures in a semiconductor substrate 210, such as a silicon substrate or silicon on oxide substrate, is provided. For the sake of reference, this new method will be referred to as the spacer-merging process. An array of mandrels 221, 222, 223, 224, and 225 is formed by a photolithography and etch process. Based on device requirement for a specific fin dimension, the mandrel array is designed to have a pitch 201 and a width 202 that are appropriate to form the desired fins. A conformal spacer material is then deposited around the mandrels 221, 222, 223, 224, and 225. In the present embodiment, the conformal spacer array is made of a hardmask material. In addition, spacer sidewalls 231, 232a, 232b, 233a, 233b, 234a, 234b, 235a, 235b, and 236 are thinner than the width of the mandrels 221, 222, 223, 224, and 225. The pitch and width of the mandrel array can be designed such that nearby facing sidewalls of a pair of adjacent mandrel structures actually touch and merge into one structure. As shown in FIG. 2B, mandrels 221, 222, 223, 224, and 225 are sandwiched between spacer sidewalls 231 and 232a, 232b and 233a, 233b and 234a, 234b and 235a, 235b and 236, respectively. Facing sidewalls 232a and 232b, 233a and 233b, 234a and 234b, and 235a and 235b are located very closely to each other, or are touching each other respectively.

Figure 3A:
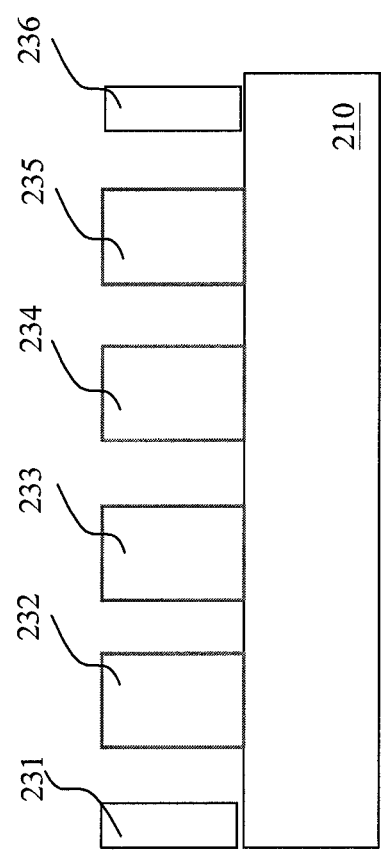
FIG. 3A and FIG. 3B are cross section and top views of an array of wider fin structures resulted from the array of mandrels and merged spacers shown in FIG. 2A and FIG. 2B.
Figure 3B:
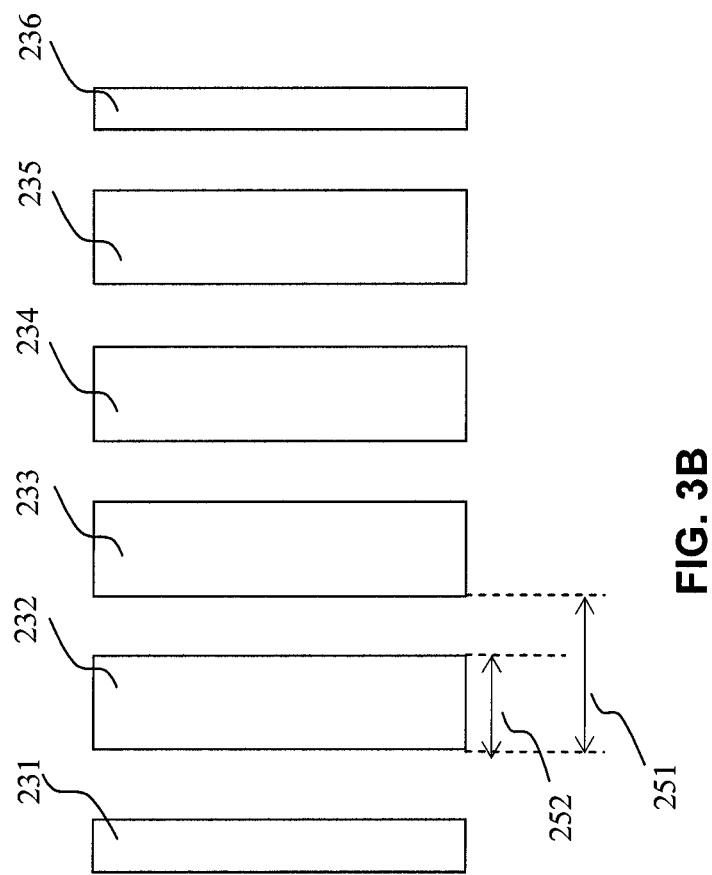

Now referring to FIGS. 3A-3B, the mandrel material between the spacers is then removed in a subsequent etching operation to leave just the spacers behind, which are now referred to as fin structures. The fin structures 232, 233, 234, and 235 are formed from joining the nearby spacers 232a and 232b, 233a and 233b, 234a and 234b respectively. As shown in FIG. 3B, the thus-formed fin structures 232, 233, 234, and 235 have a wider width 252 at a pitch 251, which is the same as the mandrel pitch 201. At the same time, fin structures 231 and 236 are not merged with other spacers; therefore fin structures 231 and 236 have their fin width unchanged. The pitch 251 having a width 252 is changed within the allowed range by the device layouts in the full process. For example, the mandrel pitch may vary from 20 nm to 200 nm, its width may vary from 10 nm to 100 nm, and the fin width 252 varies from 5 nm to 180 nm The wider vertical fin structures can be used for forming connector lines for well-pick-ups, for contact landing pads in Fin IC circuits, for BJT emitter channels, and other applications that desire wider fins.

Figure 4A:
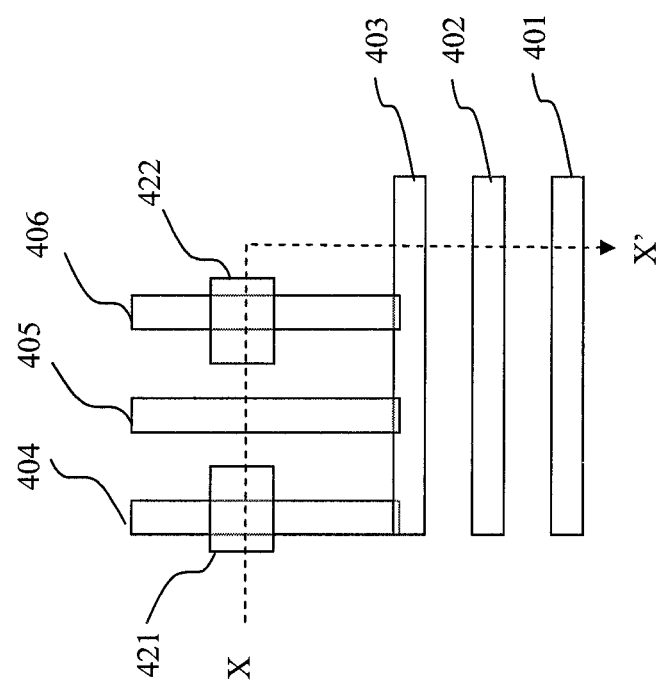
FIG. 4A is a top view of contact connections with an array of L-shaped and T-shaped spacers used in FinFET devices.
Figure 4B:
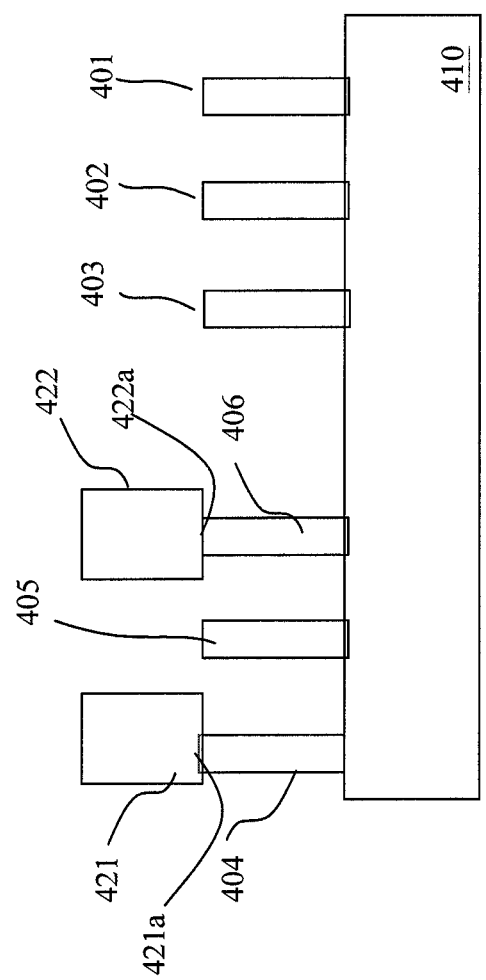
FIG. 4B illustrates a cross sectional view of the contact connections with the L-shaped and T-shaped fin array, along the X-X' cut line shown in FIG. 4A.

Referring to FIGS. 4A-4B, an array of L-shaped and T-shaped spacers is provided. Horizontal fins 401, 402, 403 and vertical fins 404, 405, and 406 are fabricated using a mandrel and spacer process similar to that in FIG. 1A, FIG. 1B, and FIG. 1C. Fin 404 is an L-shaped fin, and 405 and 406 are T-shaped fins according to their shapes in the layout. Contacts 421 and 422 are overlaid on fins 404 and 406 respectively. Fins 404 and 406 each form a contact landing surface 421a and 422a as shown in FIG. 4B. The lateral dimension of fins 401, 402, and 403 form gate channels for FinFETs, therefore they may be appropriate and do not need any changes. However, lateral dimension of connection line fins 404 and 406 are too thin for forming good contact landing.

Figure 5A:
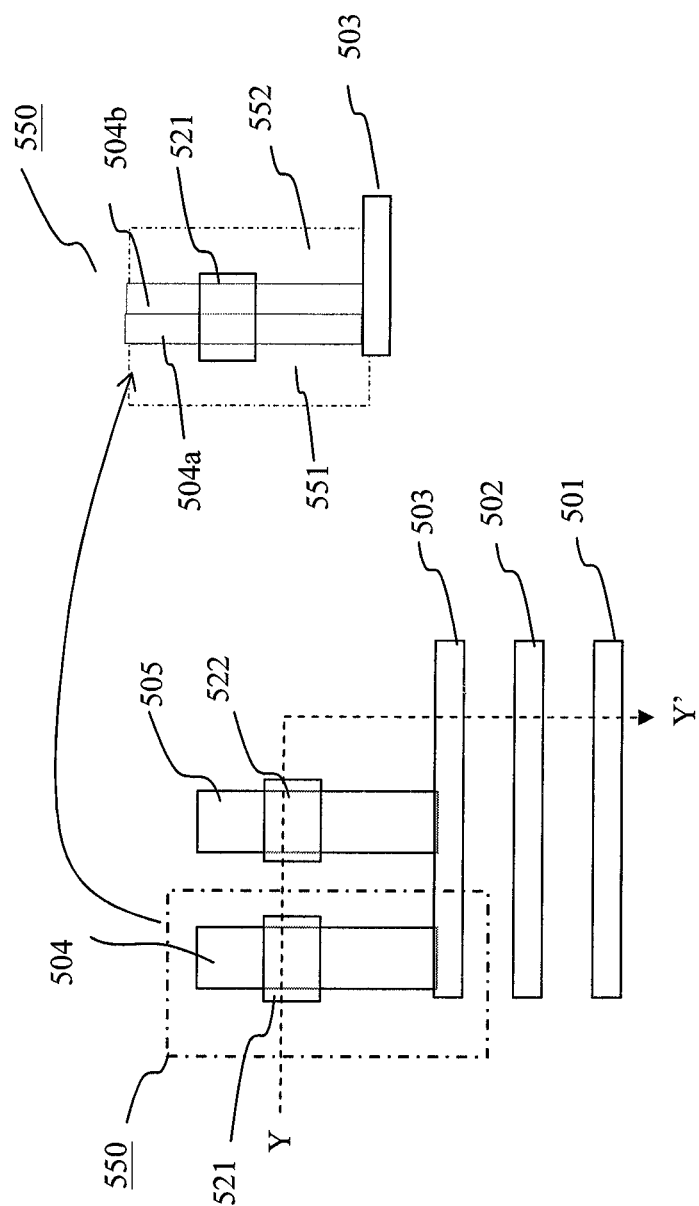
FIG. 5A is a top view of contact connections with an array of L-shaped and T-shaped spacers used in FinFET devices when merged spacer technique is applied.
Figure 5B:
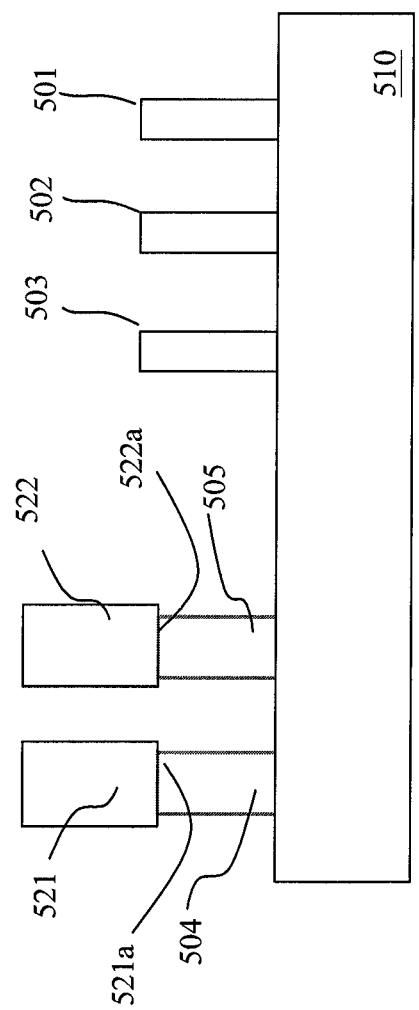
FIG. 5B is a cross sectional view of the contact connections with the L-shaped and T-shaped fin array, along the Y-Y' line shown in FIG. 5A, in accordance with some embodiments of the present disclosure.

Referring to FIGS. 5A-5B, another array of L-shaped and T-shaped spacers is provided. Horizontal fins 501, 502, 503 and vertical fins 504 and 505 are fabricated using the spacer-merging process. Fin 504 is an L-shaped fin and 505 is a T-shaped fin according to their shapes in the layout. Contacts 521 and 522 are overlaid on fins 504 and 505 respectively. Fins 504 and 505 are lines each forming a contact landing surface 521a and 522a as shown in FIG. 5B. Block 550 in FIG. 5A is enlarged to illustrate an intermediate layout with a pair of adjacent mandrels 551 and 552 and their merged sidewall spacers 504a and 504b before contact 521 is overlaid on top. And FIG. 5B illustrates a cross sectional view of a contact connection with the array of L-shaped and T-shaped spacers, along the dashed Y-Y' cut line in FIG. 5A. Lateral dimension of fins 501, 502, and 503 remain narrow to form gate channels for FinFETs. The lateral dimension of connection line fins 504 and 505 are doubled from single fins 504a and 504b, resulting in improved contact landing areas to 521a and 522a.

Figure 6:
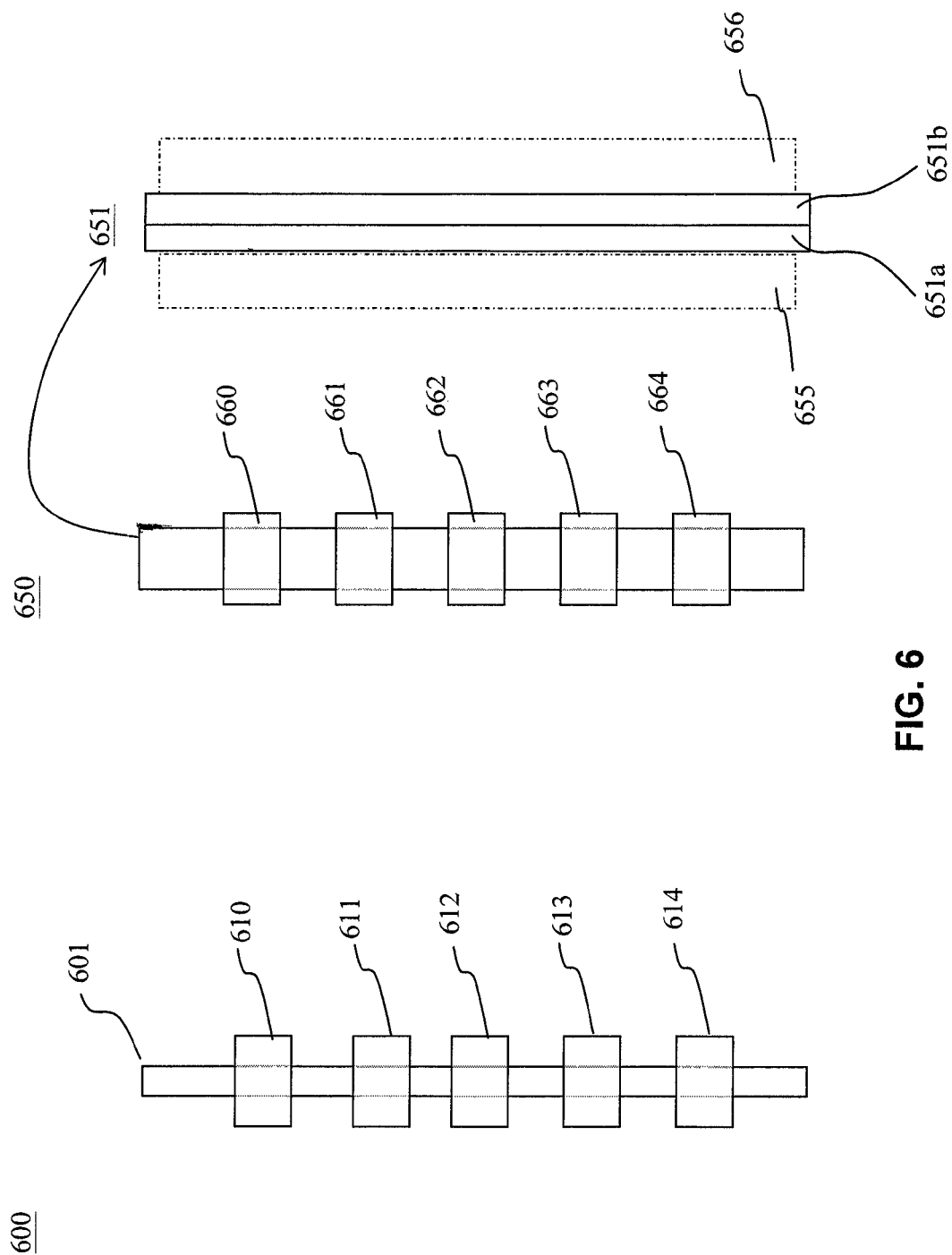
FIG. 6 compares a contact connection structure having a thin fin structure and another contact connection structure having a wider fin structure when merged spacer technique is applied, in accordance with some embodiments of the present disclosure.

Referring to FIG. 6, a contact connection structure 600 having a thin fin structure and a contact connection structure 650 having a wider fin structure are shown The fin structures can be created using the merged spacer technique, as discussed above. A narrower fin structure 601 forms connections with contacts 610, 611, 612, 613, and 614, where contact landings are limited by the lateral width of fin line 601. However, contact connection structure 650 has a wider fin structure 651 to provide contact landing areas for contacts 660, 661, 662, 663, and 664. Block 651 in FIG. 6 illustrates an intermediate layout with a pair of adjacent mandrels 655 and 656 and their merged spacers 651a and 651b before contacts 660, 661, 662, 663, and 664 are overlaid on the top surface of line 651. As a result, the lateral dimension of connection line fin 651 is broadened from the single fins 651a and 651b to form improved contact landing.

Figure 7:
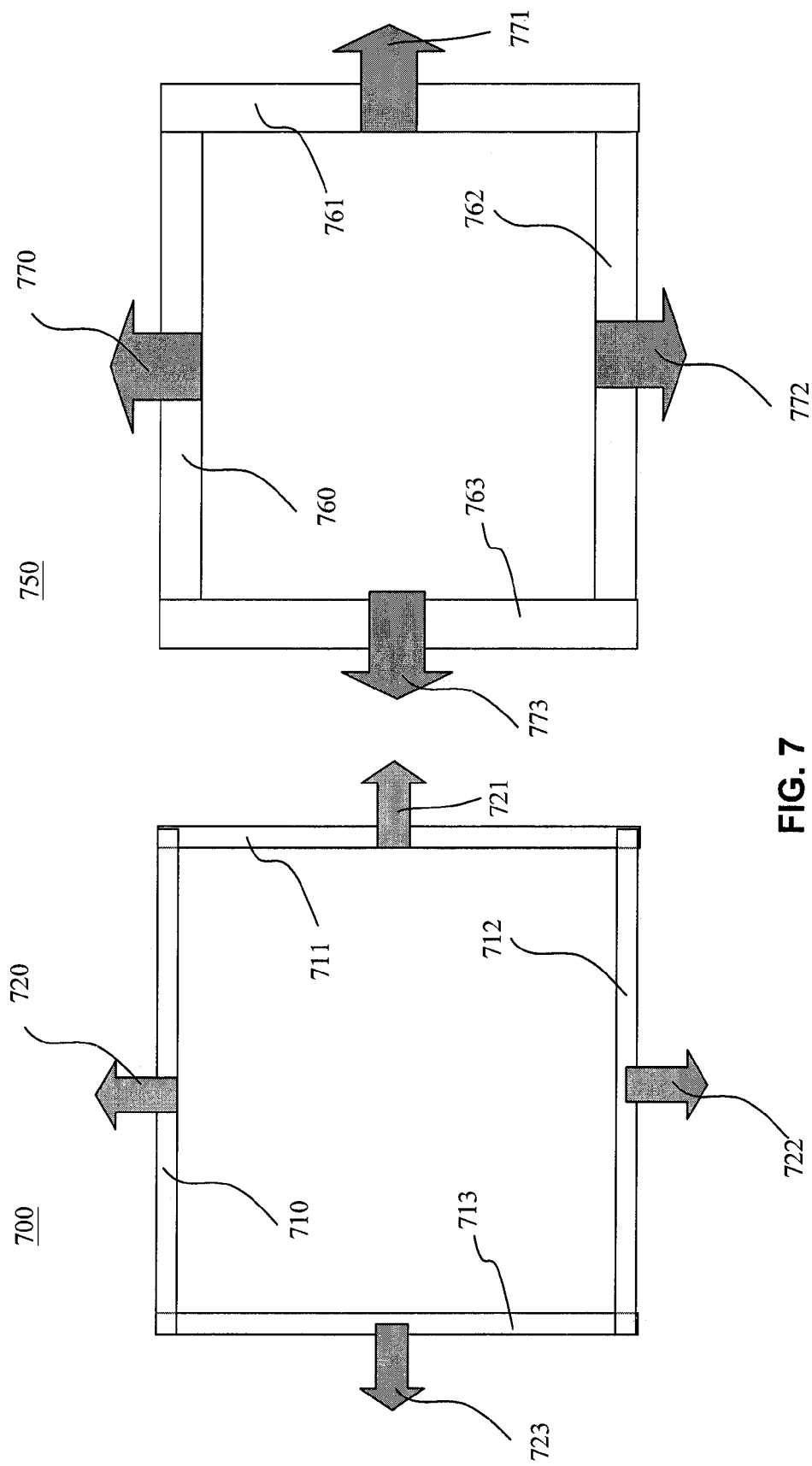
FIG. 7 compares an emitter ring of bipolar junction transistors (BJT) built on a thin fin structure and another emitter ring of BJT built on a broadened fin structure when merged spacer technique is applied, in accordance with various embodiments of the present disclosure.

FIG. 7 compares different emitter ring layouts of bipolar junction transistors (BJT) built according to the two methods discussed above. A bipolar junction transistor is a collector-base-emitter three-terminal transistor having a charge flow due to bidirectional diffusion of charge carriers across junctions from two regions of different charge concentrations.

Layout 700, formed by the method of FIG. 1, illustrates an emitter ring formed of four thin fin structure sides 710, 711, 712, and 713. Other transistor components built on the emitter ring are not shown. A BJT emitter is heavily doped to increase the emitter injection efficiency. For high current gain, most of the carriers injected into the emitter-base junction come from the emitter. Therefore, emitter injection currents 720, 721, 722, and 723 in the integrated BJT circuits can be limited from the narrow emitter fins 710, 711, 712, and 713 as fin dimension keeps on shrinking.

In layout 750, formed by the spacer-merging process, emitter injection currents 770, 771, 772, and 773 in the integrated BJT circuits are largely increased from the broadened emitter fins 760, 761, 762, and 763. The wider fins 760, 761, 762, and 763 are formed with the merged spacer technique described above. As a result of the wider emitter fins, BJT emitter efficiency is improved in 750.

Figure 8:
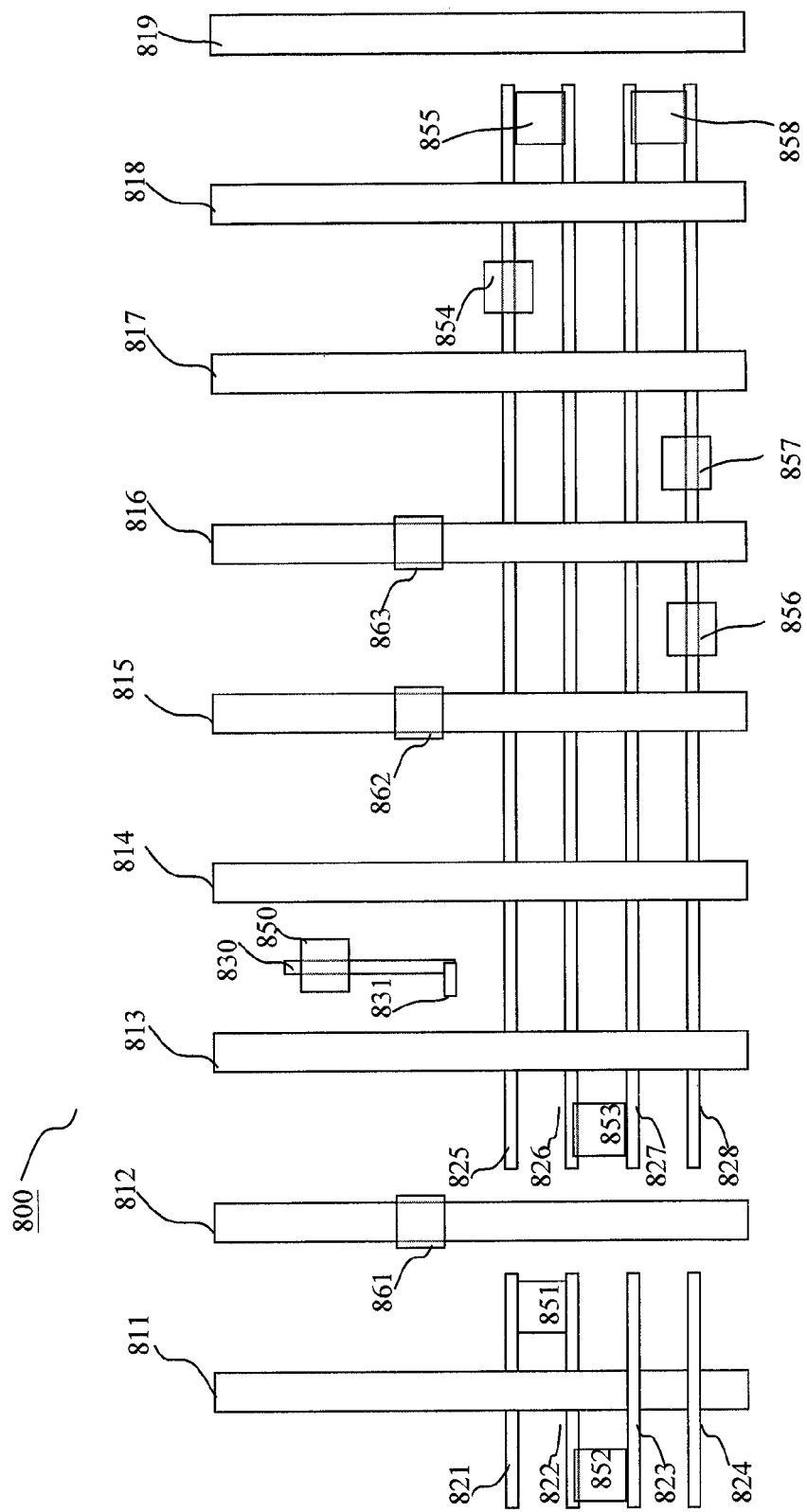
FIG. 8 is a top view of a FinFET layout including perpendicular fins, when merged spacer technique is applied, in accordance with one embodiment of the present disclosure.

FIG. 8 illustrates a top view of a FinFET layout including perpendicular fins, when merged spacer technique is applied, in accordance with one embodiment of the present disclosure. Layout 800 includes one set of vertical gates 811, 812, 813, 814, 815, 816, 817, 818, and 819, one set of horizontal fins 821, 822, 823, and 824 coupled to one vertical gate 811, another set of horizontal fins 825, 826, 827, 828 coupled to other vertical gates 813, 814, 815, 816, 817, and 818. Layout 800 also includes single-fin channel contacts 854, 856, 857 and double-fin channel contacts 851, 852, 853, 855, and 858. A single-fin channel contact lands on one fin channel (or one fin line), for example, contact 854 centers on fin line 825, contacts 856 and 857 center on fin channel 828, in an application such as contact landing on a well-pick-up line as illustrated in drawing 650 of FIG. 6, where the contact landing area is doubled from wider fin channels 825 and 828 after the spacer merging process. A double-fin channel contact connects adjacent fins by landing on each fin with one contact side respectively. For example, double-fin contacts 851 and 852 joint fins 821, 822, and 823; and double-fin contacts 853, 855, and 858 joint fins 825, 826, 827, and 828 like a daisy chain. Wider fins from the spacer merging process greatly increase process windows for both single-fin channel contacts and double-fin channel contacts, when the process windows are often limited by process tolerance for overlay and CD control.

In addition, layout 800 includes an L-shaped fin formed from a vertical fin portion 830 and a horizon fin portion 831, and a single-fin channel contact 850 landing on the vertical fin portion 830. This contact landing also has a larger overlapping area with the underneath wider fin 830, as an advantage from the spacer merging process.

Layout 800 also contains gate contacts 861, 862, and 863 overlaying vertical gates 812, 815, and 816, respectively.

Figure 9:
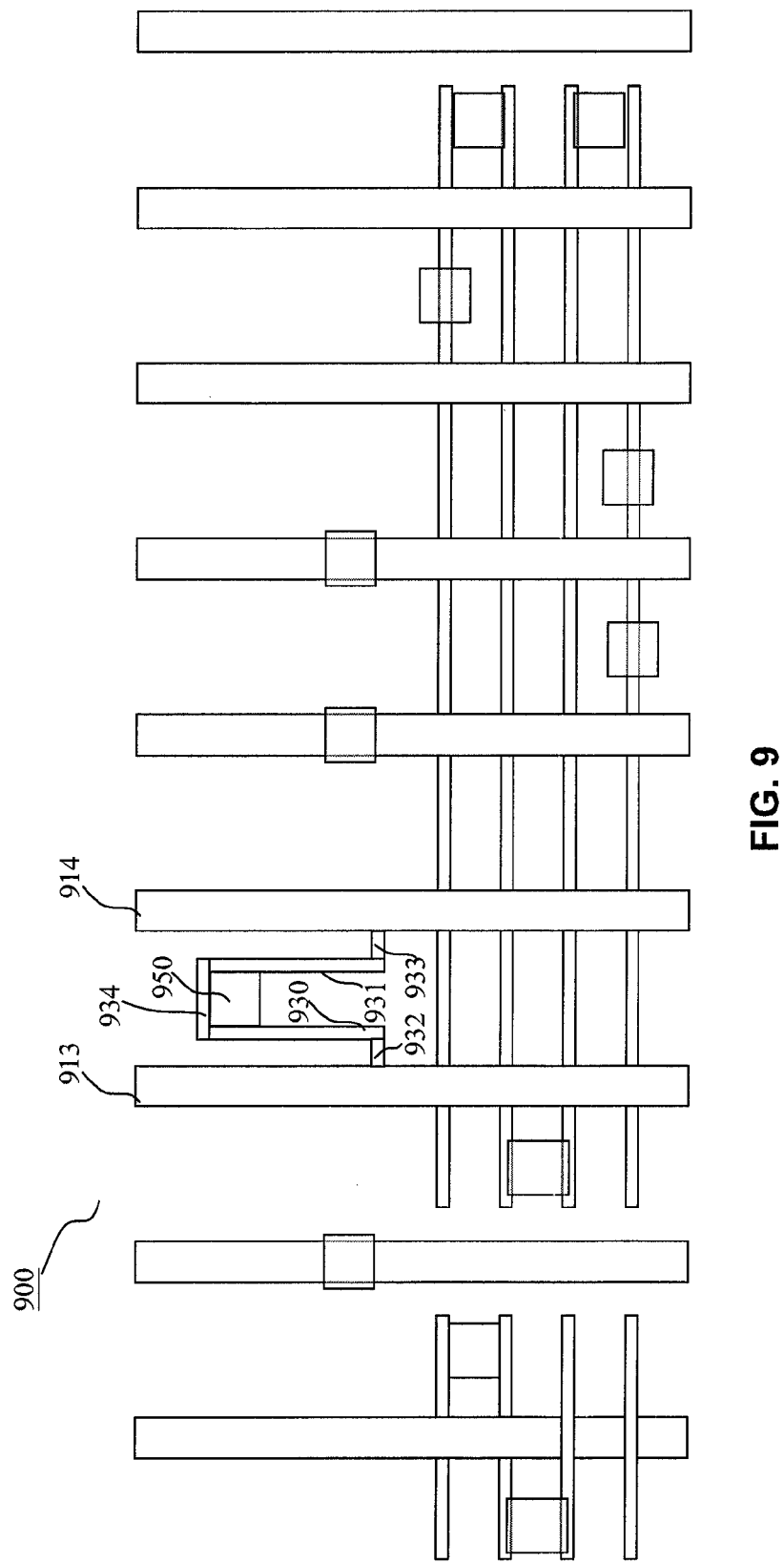
FIG. 9 is a top view of a FinFET layout including vertically positioned reverse-U-shaped fin structure, when merged spacer technique is applied, in accordance with another embodiment of the present disclosure.

FIG. 9 illustrates a top view of a FinFET layout including vertically positioned reverse-U-shaped fin structures, when merged spacer technique is applied, in accordance with another embodiment of the present disclosure. Layout 900 includes one set of vertical gates, one set of horizontal fins coupled to vertical gates, single-fin channel contacts, double-fin channel contacts, and gate contacts, similar to FIG. 8. FIG. 9 also includes a U-shaped fin structure which is formed from two vertical fin portions 930 and 931, a horizontal bridging fin portion 934 which bridges the vertical fins 930 and 931 together, and two horizontal fin legs 932 and 933. The U-shaped fin structure connects to adjacent vertical gate lines 913 and 914 via the two horizontal fin legs 932 and 933. Bridging fins like 934 are usually left from top and bottom end spacer features of a nearby mandrel after the mandrel is removed. In some process, bridging fins between neighboring elongated fins are removed. Bridging fins such as 934 may or may not get spacer merging.

Returning to FIG. 9, triple-fin channel contact 950 connects to adjacent three fins 930, 931, and 934 by landing on each fin with one side of contact 950 respectively. In this case, wider fins from the spacer merging process greatly increase the contact landing area, therefore the process window for triple-fin contact 950.

Figure 10:
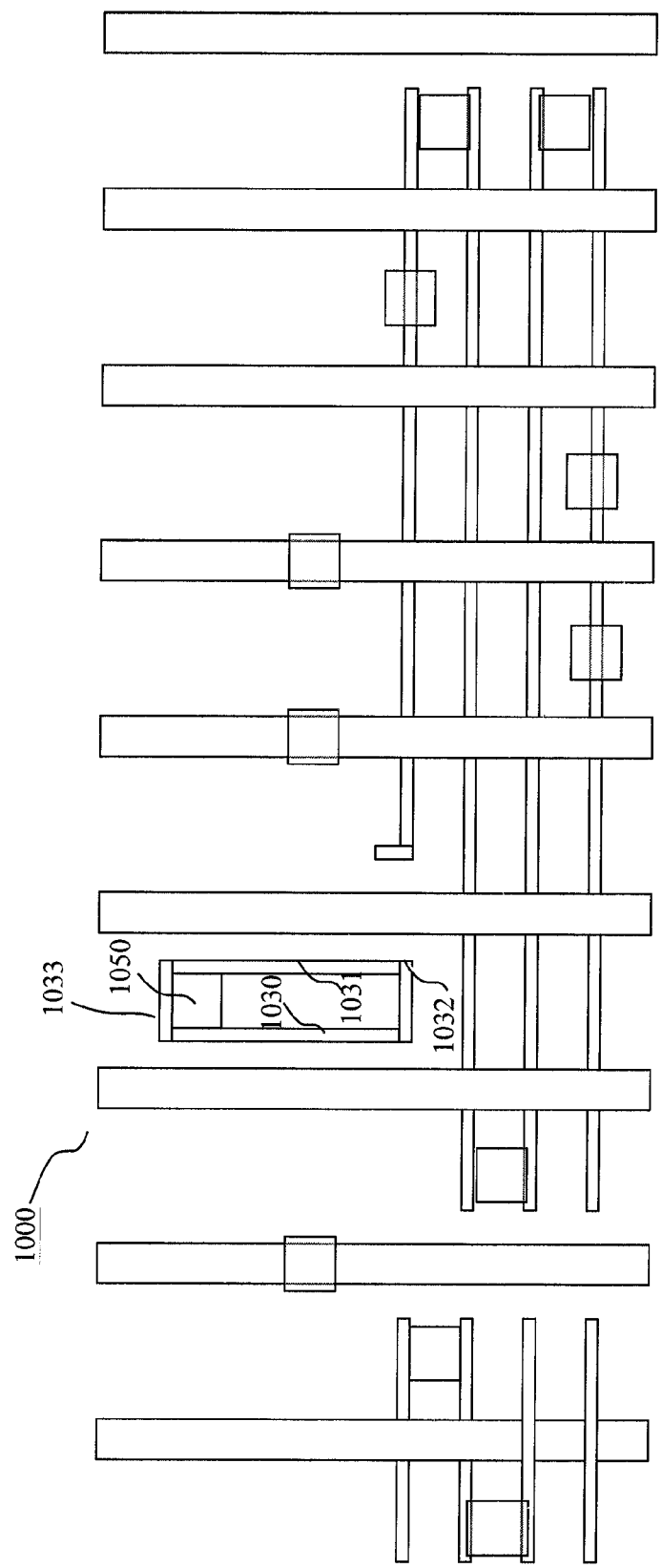
FIG. 10 is a top view of a FinFET layout including a vertically positioned rectangular fin structure, when merged spacer technique is applied, in accordance with another embodiment of the present disclosure.

FIG. 10 illustrates a top view of a FinFET layout including a vertically positioned rectangular fin structure, when merged spacer technique is applied, in accordance with another embodiment of the present disclosure. Layout 1000 includes one set of vertical gates, one set of horizontal fins coupled to vertical gates, single-fin channel contacts, double-fin channel contacts, and gate contacts, similar to FIG. 8 and FIG. 9. In addition, layout 1000 also includes a rectangular fin structure, formed from two vertical fin portions 1030 and 1031, two bridging fins 1032 and 1033, and a triple-fin channel contact 1050 connecting to adjacent three fins 1030, 1031, and 1033 by landing on each fin with one side of contact 1050 respectively. In this case, wider fins from the spacer merging process also greatly increase the contact landing area, therefore the process window for triple-fin contact 1050.

Figure 11:
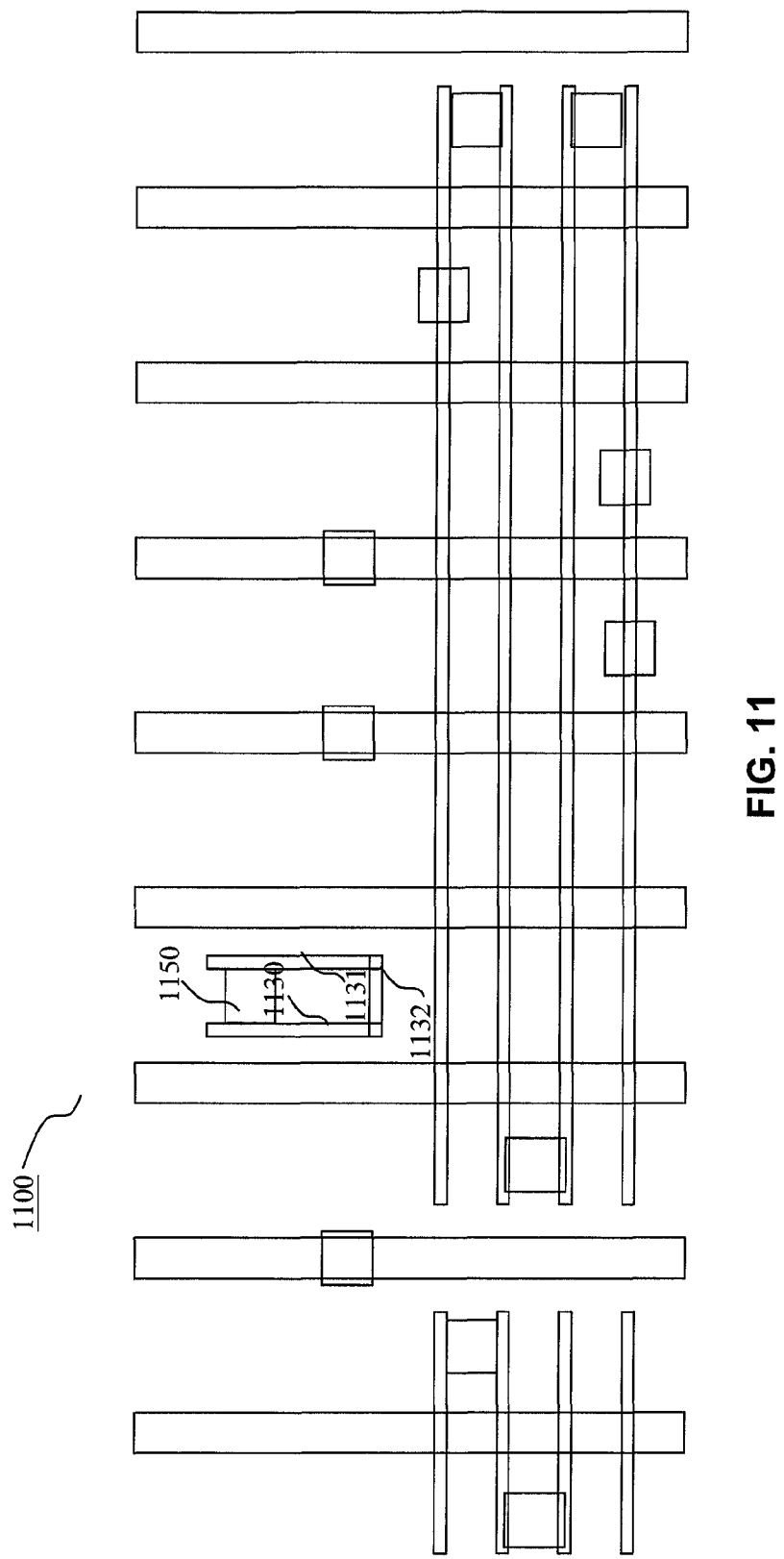
FIG. 11 is a top view of a FinFET layout including a vertically positioned U-shaped fin structure, when merged spacer technique is applied, in accordance with another embodiment of the present disclosure.

FIG. 11 illustrates a top view of a FinFET layout including a vertically positioned U-shaped fin structure, when merged spacer technique is applied, in accordance with another embodiment of the present disclosure. Layout 1100 includes one set of vertical gates, one set of horizontal fins coupled to vertical gates, single-fin channel contacts, double-fin channel contacts, and gate contacts, similar to FIG. 8, FIG. 9, and FIG. 10. In addition, layout 1100 also includes a U-shaped fin structure, formed from two vertical fin portions 1130 and 1131, one bridging fins 1132, and a double-fin channel contact 1150 connecting to adjacent two fins 1130, and 1131 by landing on each fin with one side of contact 1150 respectively. In this case, wider fins from the spacer merging process also greatly increase the landing area for double-fin contact 1150.

Figure 12:
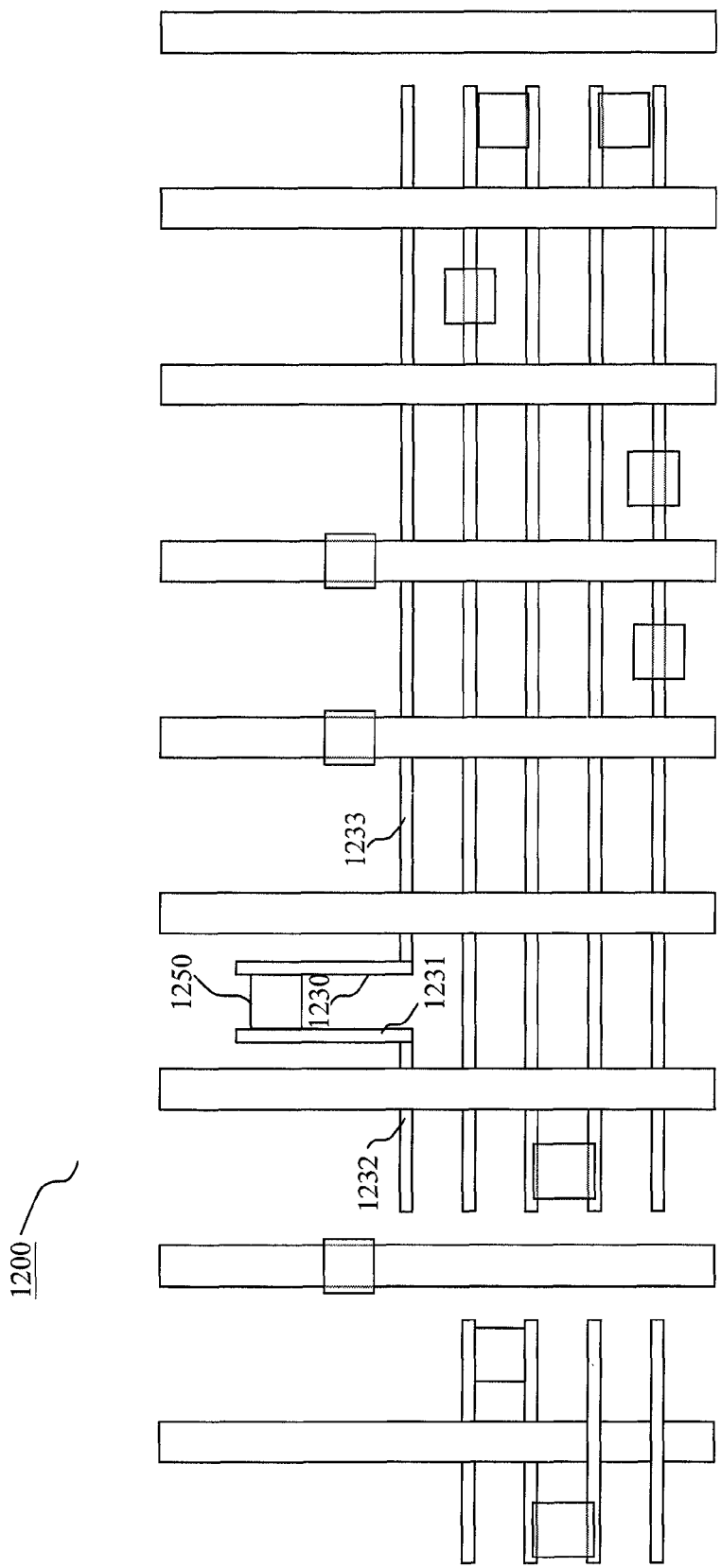
FIG. 12 is a top view of a FinFET layout including vertically positioned double fins, when merged spacer technique is applied, in accordance with another embodiment of the present disclosure.

FIG. 12 illustrates a top view of a FinFET layout including vertically positioned fins, when merged spacer technique is applied, in accordance with another embodiment of the present disclosure. Layout 1200 includes one set of vertical gates, one set of horizontal fins coupled to vertical gates, single-fin channel contacts, double-fin channel contacts, and gate contacts, similar to FIG. 8, FIG. 9, FIG. 10, and FIG. 11. In addition, layout 1200 also includes a pair of vertical fins 1230 and 1231, forming an extension into the vertical direction from horizontal fins 1232 and 1233. Consequently, a double-fin channel contact 1250 is connective to horizontal fins 1232 and 1233 via adjacent two fins 1230, and 1231 by landing on each fin with one side of contact 1250 respectively. In this layout, wider fins from the spacer merging process have greatly increased the landing area for double-fin contact 1250.

Figure 13:
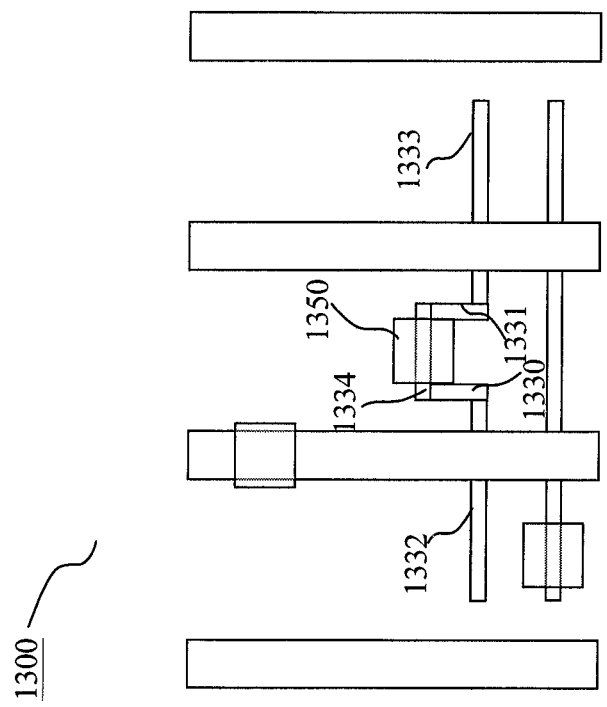
FIG. 13 is a top view of a FinFET layout including a T-shaped fin structure for improved contact landing, when merged spacer technique is applied, in accordance with another embodiment of the present disclosure.

FIG. 13 illustrates a top view of a FinFET layout including a T-shaped fin structure for improved contact landing, when merged spacer technique is applied, in accordance with another embodiment of the present disclosure. Layout 1300 includes one set of vertical gates, one set of horizontal fins coupled to vertical gates, single-fin channel contacts, and gate contacts. In addition, layout 1300 also includes a pair of short vertical fins 1330 and 1331, forming an extension into the vertical direction from horizontal fins 1332 and 1333, a bridging fin 1334, and a triple-fin channel contact 1350. The triple-fin channel contact 1350 is formed centered on the bridging fin 1334 and also coupled to adjacent two vertical fins 1330 and 1331 by landing on each fin with one side of contact 1350 respectively. In this layout, wider fins from the spacer merging process have also largely increased the landing area for triple-fin contact 1350.

Figure 14:
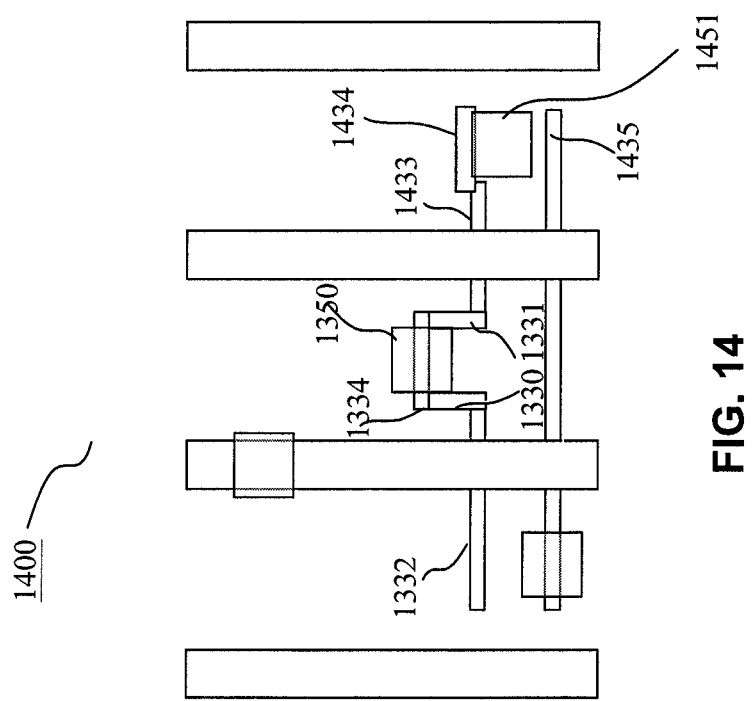
FIG. 14 is a top view of a FinFET layout including a T-shaped fin structure and an extrusion fin for improved contact landing, when merged spacer technique is applied, in accordance with another embodiment of the present disclosure.

FIG. 14 illustrates a top view of a FinFET layout including a T-shaped fin structure and an extrusion fin structure for improved contact landing, when merged spacer technique is applied, in accordance with another embodiment of the present disclosure. FIG. 14 has every component from FIG. 13. In addition, layout 1400 also includes an extrusion fin 1434 coupled with a horizontal fin 1433. Extrusion 1434 is a slightly offset structure connected end-to-end with fin line 1433. The purpose of the extrusion fin structure is to shift the position of contact 1451 up from the lower fin line 1435. Without extrusion 1434 to offset contact 1451, the lower fin line 1435 may short circuit with contact 1451 at a tight line pitch.

Figure 15:
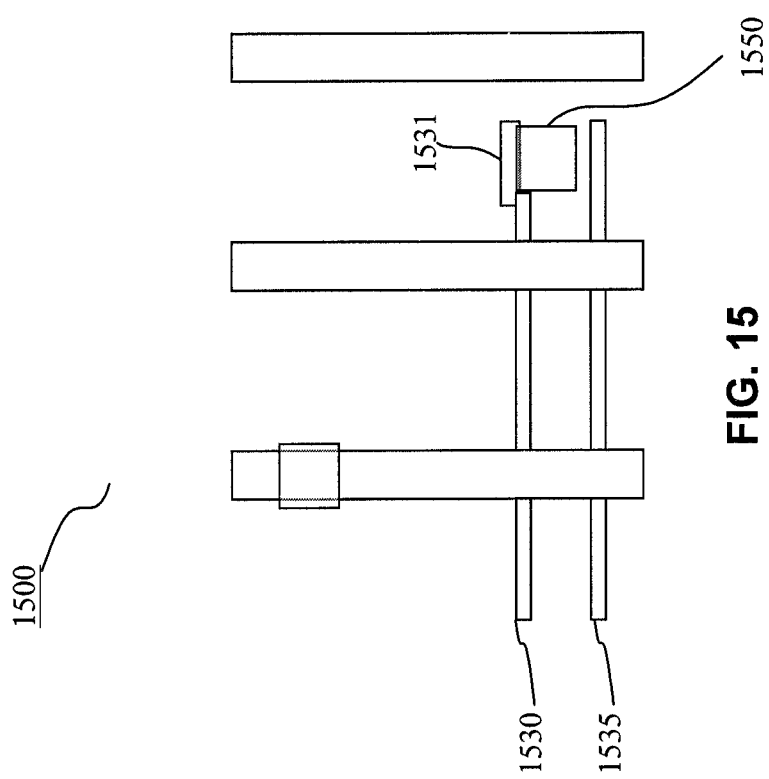
FIG. 15 is a top view of a FinFET layout including an extrusion fin structure for improved contact landing, when merged spacer technique is applied, in accordance with another embodiment of the present disclosure.

FIG. 15 illustrates a top view of a FinFET layout including an extrusion fin structure for improved contact landing, when merged spacer technique is applied, in accordance with another embodiment of the present disclosure. Layout 1500 includes an extrusion fin 1531 slightly displaced from, but still connected to horizontal fin 1530. Contact 1550 couples to fin 1531 on its top side, but does not connect to the adjacent lower fin line 1535. Similar to FIG. 14, without extrusion 1531 to offset contact 1550, the lower fin line 1535 may short circuit with contact 1550 at a tight line pitch.

Figure 16:
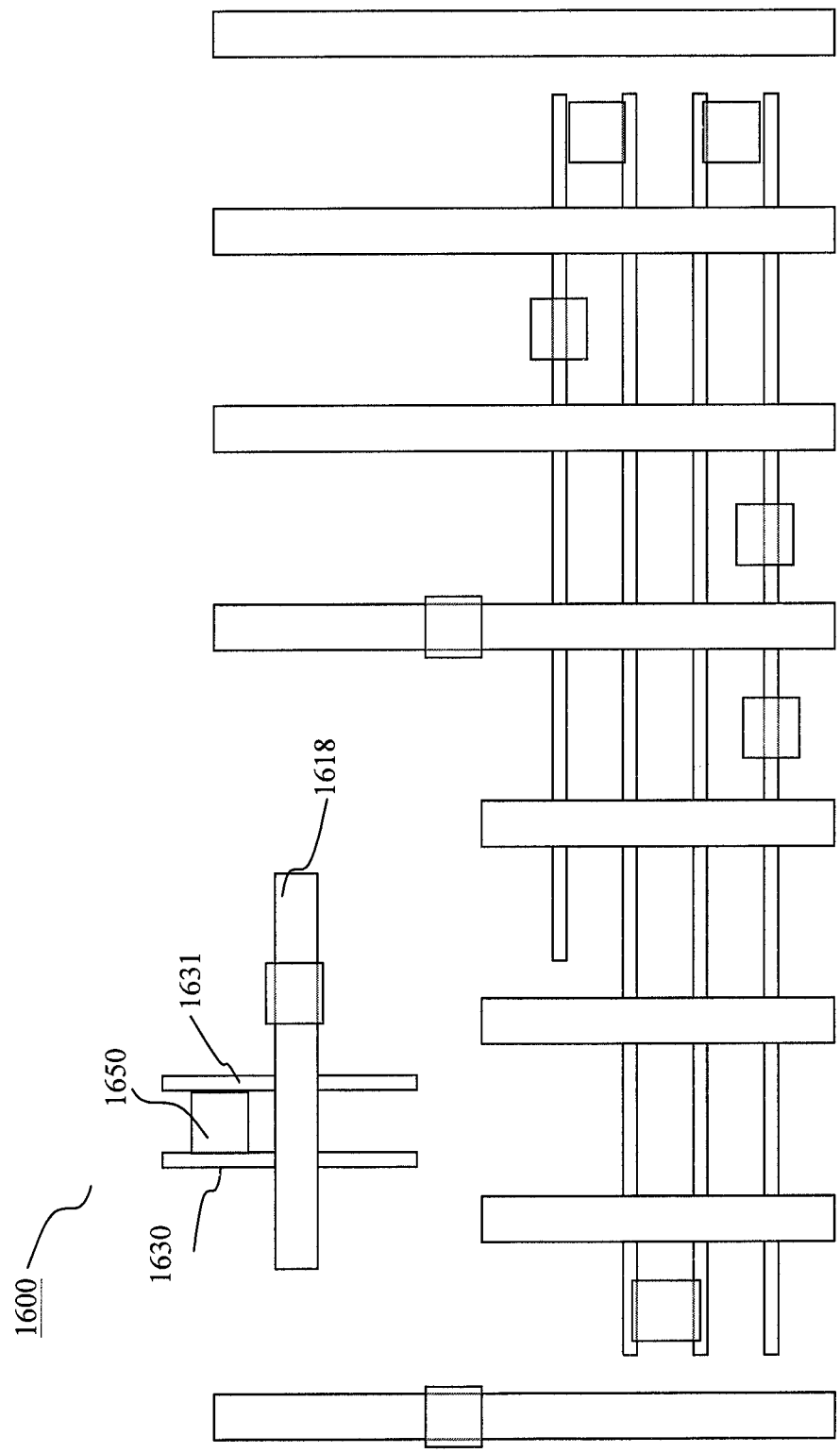
FIG. 16 is a top view of a bi-directional FinFET layout including multiple fins on a horizontal gate structure, when merged spacer technique is applied, in accordance with some more embodiments of the present disclosure.

FIG. 16 illustrates a top view of a bi-directional FinFET layout including multiple fins on a horizontal gate structure, when merged spacer technique is applied, in accordance with some more embodiments of the present disclosure. Layout 1600 includes one set of vertical gates, one set of horizontal fins coupled to vertical gates, single-fin channel contacts, double-fin channel contacts, and gate contacts, similar to previous figures. Layout 1600 also includes a horizontal gate 1618, a pair of vertical fins 1630 and 1631 intersecting the horizontal gate 1618, and a double-fin channel contact 1650. Contact 1650 couples to adjacent two fins 1630 and 1631 by landing on each fin with one side of contact 1650 respectively. In this layout, wider fins from the spacer merging process have also increased contact landing area, consequently the process window for the double-fin contact 1650 near a gate line is enlarged.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor FinFET device, comprising:
   a plurality of gate lines formed in a first direction;
   first fin structures formed in a second direction;
   second fin structures formed perpendicular to the first fin structures; and
   a contact feature coupled to a first fin of the second fin structures,
   wherein the first fin of the second fin structures is coupled to a first of the first fin structures.

2. The semiconductor FinFET device as claim 1, wherein the contact feature is further coupled to a second fin of the second fin structures.

3. The semiconductor FinFET device as claim 1, wherein a second fin of the second fin structures is coupled to the first fin of the first fin structures, and
   wherein the contact feature is further coupled to the second fin of the second fin structures.

4. The semiconductor FinFET device as claim 1, wherein the first fin of the first fin structures is in contact with a first gate line of the plurality of gate lines, and
   wherein the contact feature is further coupled to a second fin of the second fin structures.

5. The semiconductor FinFET device as claim 1, wherein fins of the first fin structures have a lateral width ranging from 5 nm to 180 nm.

6. The semiconductor FinFET device as claim 1, wherein fins of the second fin structures have a lateral width ranging from 5 nm to 180 nm.

7. A semiconductor FinFET device, comprising:
   a plurality of gate lines;
   a first fin structure intersecting at least one of the gate lines;
   a second fin structure displaced from but coupled to an end portion of one fin of the first fin structure as an extrusion feature, the extrusion feature not being coupled to another fin structure, and
   a contact feature coupled to the extrusion feature of the second fin structure.

8. The semiconductor FinFET device as claim 7, further comprising:
   a third fin structure disposed perpendicular to the first fin structure and coupled to the first fin structure; and
   another contact feature coupled to two fins of the third fin structure.

9. The semiconductor FinFET device as claim 8, further comprising:
   a fourth fin structure parallel to the first fin structure and coupled to the two fins of the third fin structure and the another contact feature.

10. The semiconductor FinFET device as claim 7, wherein the extrusion feature of the second fin structure has a lateral width ranging from 5 nm to 180 nm.

11. A semiconductor FinFET device, comprising:
    a first set of gate lines formed in a first direction;
    a second set of gate lines formed in a second direction, wherein the first and second directions are perpendicular to each other;
    first fin structures intersecting the first set of gate lines in the second direction;
    second fin structures intersecting the second set of gate lines in the first direction; and
    a first contact feature coupled to two fins of the second fin structures.

12. The semiconductor FinFET device as claim 11, wherein one fin of the first fin structures is coupled to the two fins of the second fin structures.

13. The semiconductor FinFET device as claim 12, wherein the contact feature is further coupled to the one fin of the first fin structures.

14. The semiconductor FinFET device as claim 11, wherein the first fin structures have a lateral width ranging from 5 nm to 180 nm.

15. The semiconductor FinFET device as claim 11, wherein the second fin structures have a lateral width ranging from 5 nm to 180 nm.

16. A semiconductor FinFET device, comprising:
    a first set of gate lines formed in a first direction;
    a second set of gate lines formed in a second direction, wherein the first and second directions are perpendicular to each other;
    first fin structures of a first type intersecting the first set of gate lines in the second direction;
    second fin structures of a second type intersecting the second set of gate lines in the first direction;
    a first contact hole coupled to one or more of the first or second fin structures, and
    a third fin structure of a third type, wherein the third fin structure is displaced from but coupled to one of the first fin structures as an extrusion feature, and wherein a second contact hole is coupled to the extrusion feature of the third fin structure.

17. The semiconductor FinFET device as claim 11, further comprising a fourth fin structure, wherein the fourth fin structure is displaced from but coupled to one of the second fin structures as an extrusion feature, and wherein a fourth contact hole is coupled to the extrusion feature of the fourth fin structure.

* * * * *